United States Patent
Ishii et al.

(10) Patent No.: US 7,923,695 B2
(45) Date of Patent: Apr. 12, 2011

(54) RADIATION IMAGE PICK-UP DEVICE AND METHOD THEREFOR, AND RADIATION IMAGE PICK-UP SYSTEM

(75) Inventors: Takamasa Ishii, Honjo (JP); Masakazu Morishita, Hiratsuka (JP); Chiori Mochizuki, Sagamihara (JP); Minoru Watanabe, Honjo (JP); Keiichi Nomura, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/349,733

(22) Filed: Jan. 7, 2009

(65) Prior Publication Data

US 2009/0185659 A1    Jul. 23, 2009

Related U.S. Application Data

(62) Division of application No. 10/576,349, filed as application No. PCT/JP2004/017039 on Nov. 10, 2004, now Pat. No. 7,488,948.

(30) Foreign Application Priority Data

Nov. 21, 2003   (JP) ................................ 2003-392725
Jul. 14, 2004    (JP) ................................ 2004-207273

(51) Int. Cl.
 *G01T 1/24*   (2006.01)
 *H01L 27/14*  (2006.01)
(52) U.S. Cl. .............................. 250/370.08; 250/370.14
(58) Field of Classification Search ............. 250/370.08, 250/370.14
See application file for complete search history.

(56) References Cited

U.S. PATENT DOCUMENTS

| | | | |
|---|---|---|---|
| 5,528,043 A | 6/1996 | Spivey et al. | 250/370.09 |
| 5,780,884 A | 7/1998 | Kumagai et al. | 257/236 |
| 5,973,311 A | 10/1999 | Sauer et al. | 250/208.1 |
| 6,075,256 A | 6/2000 | Kaifu et al. | 257/53 |
| 6,300,635 B1 * | 10/2001 | Brambilla et al. | 250/370.07 |

(Continued)

FOREIGN PATENT DOCUMENTS

| | | |
|---|---|---|
| EP | 0 660 421 | 6/1995 |
| EP | 0 918 434 A2 | 5/1999 |
| EP | 1 207 560 A2 | 5/2002 |
| JP | 8-116044 | 5/1996 |
| JP | 8-256293 | 10/1996 |
| JP | 10-93868 A | 4/1998 |
| JP | 2001-177776 | 6/2001 |
| RU | 2 012 156 C1 | 4/1994 |
| WO | 03-049190 | 6/2003 |

OTHER PUBLICATIONS

Russian Office Action and its English translation, dated Oct. 18, 2007, regarding Application No. 2006121971/09 (023867).

*Primary Examiner* — David P Porta
*Assistant Examiner* — Carolyn Igyarto
(74) *Attorney, Agent, or Firm* — Fitzpatrick, Cella, Harper & Scinto

(57) ABSTRACT

Sensitivity is freely changeable to another one in correspondence to a photographing mode, and both still image photographing and moving image photographing for example which are largely different from each other in dosage of exposure to radiation and which are also different from each other in required sensitivity are carried out so as to meet that request. A source or drain electrode of a TFT 21 is connected to a signal output circuit 3 through a signal line 14a and an IC 5. A source/drain of a TFT 23 is connected to the signal output circuit 3 through a signal line 14b and the IC 5. Thus, in each pixel 6, any one of the signal lines 14a and 14b is freely selectable when a signal is read out.

11 Claims, 13 Drawing Sheets

U.S. PATENT DOCUMENTS

| | | |
|---|---|---|
| 6,906,302 B2 | 6/2005 | Drowley .................... 250/208.1 |
| 6,967,332 B2 * | 11/2005 | Kobayashi et al. ...... 250/370.09 |
| 7,205,547 B2 | 4/2007 | Ishii et al. ................ 250/370.09 |
| 7,205,568 B2 | 4/2007 | Watanabe et al. ................ 257/59 |
| 7,381,965 B2 | 6/2008 | Ishii et al. ................ 250/370.11 |
| 7,538,330 B2 | 5/2009 | Nomura et al. .......... 250/370.11 |
| 2004/0195490 A1 | 10/2004 | Sugiyama et al. ......... 250/208.1 |
| 2006/0062352 A1 | 3/2006 | Nomura et al. .............. 378/98.8 |
| 2006/0065944 A1 | 3/2006 | Mochizuki et al. ........... 257/444 |
| 2006/0249763 A1 | 11/2006 | Mochizuki et al. ........... 257/291 |
| 2007/0045556 A1 | 3/2007 | Watanabe et al. ........ 250/370.14 |
| 2007/0131867 A1 | 6/2007 | Okada et al. ............. 250/370.09 |
| 2007/0146520 A1 | 6/2007 | Watanabe et al. ............. 348/308 |
| 2007/0187609 A1 * | 8/2007 | Karim ..................... 250/370.09 |

\* cited by examiner

RADIATION IMAGE PICK-UP DEVICE AND METHOD THEREFOR, AND RADIATION IMAGE PICK-UP SYSTEM

RELATED APPLICATIONS

This application is a divisional of application Ser. No. 10/576,349, filed Apr. 18, 2006, claims benefit of that application under 35 U.S.C. §120, and claims benefit under 35 U.S.C. §119 of Japanese patent applications nos. 2003-392725, filed Nov. 21, 2003, and 2004-207273, filed Jul. 14, 2004. The entire disclosure of each of the three mentioned prior applications is incorporated herein by reference.

TECHNICAL FIELD

The present invention relates to a radiation image pick-up device and method for photographing an image of incident radiation, and a radiation image pick-up system, and is applied to a medical image diagnosis apparatus, a non-destructive inspection apparatus, and an analyzer using radiation. Note that, it is supposed that in this specification, an electromagnetic wave such as visible light, X-rays, as well as ($\alpha$-rays, $\beta$-rays, $\gamma$-rays, and the like are also included within the broad scope of the term "radiation".

BACKGROUND ART

Recent advances in the liquid crystal panel manufacturing techniques using thin film transistors (TFTs), and utilization of an area server having a semiconductor conversion element in various fields (e.g., in the field of a medical X-ray image pick-up device), have enabled increased surface area and digitization for medical radiation image pick-up devices as well. The medical radiation image pick-up device, unlike a liquid crystal panel and the like, has a feature in that a minute signal is digitized to output a corresponding image, and hence can photograph an image of radiation instantaneously to display the photographed image on a display device in an instant. At the present time, as for such a radiation image pick-up device, one for still image photographing has been commercialized.

FIG. 11 is a schematic plan view schematically showing an example of a conventional radiation image pick-up device, FIG. 12 is an equivalent circuit diagram of the conventional radiation image pick-up device shown in FIG. 11, and FIG. 13 is an equivalent circuit diagram of one pixel and a signal reading circuit in the conventional radiation image pick-up device shown in FIG. 11 (refer to JP 8-116044 A for example). Hereinafter, a case where an image of X-ray as radiation is photographed will be described.

As shown in FIG. 11, the conventional radiation image pick-up device includes a sensor substrate 101 in which a plurality of pixels each having a photoelectric conversion function are disposed, a scanning circuit 102 for scanning the pixels, a signal output circuit 103 for outputting signals from the pixels, ICs 104 through which the sensor substrate 101 and the scanning circuit 102 are connected to each other, and ICs 105 through which the sensor substrate 101 and the signal output circuit 103 are connected to each other.

As shown in FIG. 12, a plurality of pixels 106 are disposed in matrix in the sensor substrate 101. Note that 3×4 pixels are illustrated in the pixel area for the sake of convenience in FIG. 12, in actuality, a large number of pixels, 1,000×2,000 pixels for example, are disposed therein. In addition, similarly, the illustration of ICs of the scanning circuit is omitted here for the sake of convenience.

As shown in FIGS. 12 and 13, each pixel 106 is constituted by a photoelectric conversion element 111 as a semiconductor element for converting incident X-rays into electric charges, and a thin film transistor (TFT) 112 acting as a switching element for reading out the resultant electric charges.

In each pixel 106, the photoelectric conversion element 111 is connected to the signal output circuit 103 through a bias line 110 which is common to all the pixels, and thus a constant bias voltage is applied from the signal output circuit 103 to the photoelectric conversion element 111. In addition, in each pixel 106, a gate electrode of the TFT 112 is connected to the scanning circuit 102 through the IC 104 (not shown) and a gate line 113 which is common to every row in the matrix. Thus, the scanning circuit 102 controls an operation (turn-ON/turn-OFF) of the TFT 112. In addition, in each pixel 106, a source or drain electrode of the TFT 112 is connected to the signal output circuit 103 through the IC 105 by way of a signal reading wiring (signal line) 114 which is common to every column in the matrix.

As shown in FIGS. 12 and 13, the IC 105 includes an amplifier 115 serving as a signal reading circuit. One input terminal of the amplifier 115 is connected to the signal line 114, and the other input terminal thereof is connected to a power supply 116. Moreover, a gain switching circuit 117 having capacitors Cf1, Cf2, and Cf3 is connected to the amplifier 115, and thus a gain of the amplifier 115 can be switched over to another one through the combination of the capacitors Cf1, Cf2, and Cf3.

Here, as shown in FIG. 13, a capacity of the photoelectric conversion element 111 is assigned C1, a parasitic capacity of the signal line 114 is assigned C2, and a capacity of the amplifier 115 is assigned Cf. An X-ray applied to a subject for exposure is attenuated as it is transmitted through the subject to be wavelength-converted into visible light by a phosphor layer (wavelength conversion member)(not shown). The resultant visible light is then made incident on the photoelectric conversion element 111 to be converted into electric charges Q.

Subsequently, upon turn-ON of the TFT 112, the gain of 1/Cf-fold is set in the amplifier 115. As a result, an output voltage Vout is expressed by Vout=−Q/Cf, and this voltage signal is then read out from the signal output circuit 103 to the outside. After completion of the operation for reading out the voltage signal Vout, the electric charges which are generated in the photoelectric conversion element 111 but remained untransferred are removed due to a change in electric potential of the common bias line 110.

However, the above-described conventional radiation image pick-up device principally aims at photographing a still image, and hence sensitivity (S/N ratio) is fixed at constant. Thus, the S/N ratio may become insufficient depending on the photographing modes. That is, the conventional radiation image pick-up device involves a problem in that it has little tolerance for differences in the attenuation of the X-rays between different subjects, or for large differences in the dosage of exposure to the X-rays such as when still image photographing and moving image photographing are performed.

DISCLOSURE OF THE INVENTION

In light of the foregoing, the present invention has been made in order to solve the above-mentioned problems, and it is therefore an object of the present invention to provide an inexpensive and high-performance radiation image pick-up device and a method therefor, and an inexpensive and high-performance radiation image pick-up system which are capable of freely switching sensitivity over to another one in correspondence to a situation and an object of the image photographing to flexibly cope therewith, i.e., capable of carrying out both still image photographing and moving image photographing for example which are largely different from each other in dosage of exposure to radiation and which are also different in required sensitivity so as to meet that request.

A radiation image pick-up device of the present invention includes: a plurality of pixels disposed in matrix, each of the pixels including at least one photoelectric conversion element for converting incident radiation into electric charges; and a signal output circuit for outputting signals from the pixels, in which a plurality of signal reading wirings through which the pixel and the signal output circuit are connected to each other are provided for each pixel.

In further aspect of the radiation image pick-up device of the present invention, the photoelectric conversion element includes a wavelength conversion member for performing wavelength conversion on incident radiation.

In further aspect of the radiation image pick-up device of the present invention, each of the pixels includes semiconductor elements connected to the signal reading wirings, and any one of the signal reading wirings is freely selectable based on actuation of the semiconductor elements.

In further aspect of the radiation image pick-up device of the present invention, at least one of the semiconductor elements is a source follower.

In further aspect of the radiation image pick-up device of the present invention, a signal reading circuit for reading out a signal from the pixel is provided to each of the signal reading wirings.

In further aspect of the radiation image pick-up device of the present invention, a signal reading circuit for reading out a signal from the pixel is provided in common to the signal reading wirings.

In further aspect of the radiation image pick-up device of the present invention, the two signal reading circuits are provided.

A radiation image pick-up method of the present invention includes using a device which includes: a plurality of pixels disposed in matrix, each of the pixels including at least one photoelectric conversion element for converting incident radiation into electric charges; and a signal output circuit for outputting signals from the pixels, in which any one of a plurality of signal reading wirings which are provided for each pixel and through which the corresponding pixel and the signal output circuit are connected to each other is selected in correspondence to a photographing mode to be used.

In further aspect of the radiation image pick-up method of the present invention, the photoelectric conversion element performs wavelength conversion on incident radiation, and converts the conversion results into electric charges.

In further aspect of the radiation image pick-up method of the present invention, any one of the plurality of signal reading wirings is selected in correspondence to magnitude of a dosage of radiation.

In further aspect of the radiation image pick-up method of the present invention, each of the pixels includes semiconductor elements connected to the plurality of signal reading wirings, and at least one of the semiconductor elements is a source follower, and when in case of the photographing mode involving a low dosage of radiation, the signal reading wiring having the source follower is selected.

A radiation image pick-up system of the present invention includes: a radiation image pick-up device; radiation generation means for applying radiation; selection means for selecting any one of the plurality of signal reading wirings in the radiation image pick-up device in correspondence to magnitude of a dosage of radiation; and control means for controlling the application of the radiation by the radiation generation means and drive of the radiation image pick-up device based on the selection by the selection means.

In further aspect of the radiation image pick-up system of the present invention, there is further provided a photographing switch with which any one of the plurality of signal reading wirings is freely selectable based on an input by an operator, and the selection means selects any one of the signal reading wirings based on input made with the photographing switch.

In further aspect of the radiation image pick-up system of the present invention, the photographing switch is adapted to be switched ON into a plurality of strokes corresponding to the number of the signal reading wirings, and the respective strokes correspond to an increase in dosage of radiation in ascending order.

In light of the fact that the conventional radiation image pick-up device aims principally at photographing a still image and thus the sensitivity (S/N ratio) is fixed at constant, the inventors of the present invention have earnestly carried out the examination in order to extend the sensitivity depending on the photographing modes (such as still image photographing and moving image photographing). As a result, the inventors have hit upon such a device that a plurality of signal reading wirings (signal wirings) are distributed for each pixel, and signal reading circuits and the like corresponding to the photographing modes are provided for the signal wirings, respectively, to allow any one of the signal wirings to be freely selectable.

More specifically, for example, two signal wirings are distributed for each pixel, and one signal line is provided for the still image photographing. The still image photographing corresponds to the photographing mode involving a high dosage of exposure to the radiation, and hence the required sensitivity is relatively low. Thus, there is adopted a configuration that the electric charge amplification is not carried out within the pixel, but is carried out in the signal reading circuit connected to the signal line concerned for example. On the other hand, the other signal wiring is provided for the moving image photographing. The moving image photographing corresponds to the image photographing mode involving a low dosage of exposure to the radiation, and hence the required sensitivity is relatively high. Thus, there is adopted a configuration that the electric charge amplification is carried out within the pixel to suppress generation of any of noises.

According to the present invention, there are realized the inexpensive and high-performance radiation image pick-up device and radiation image pick-up system which are capable of freely switching sensitivity over to another one in correspondence to a situation and an object of the image photographing to flexibly cope therewith, i.e., capable of carrying out both still image photographing and moving image photographing for example which are largely different from each other in dosage of exposure to radiation and which are also different in required sensitivity so as to meet that request.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Embodiments of the present invention will hereinafter be described in detail with reference to the accompanying drawings. A case where a photograph of a subject is taken using X-rays as radiation will be described herein.

First Embodiment

First of all, a first embodiment of the present invention will hereinafter be described.

Figure 1:
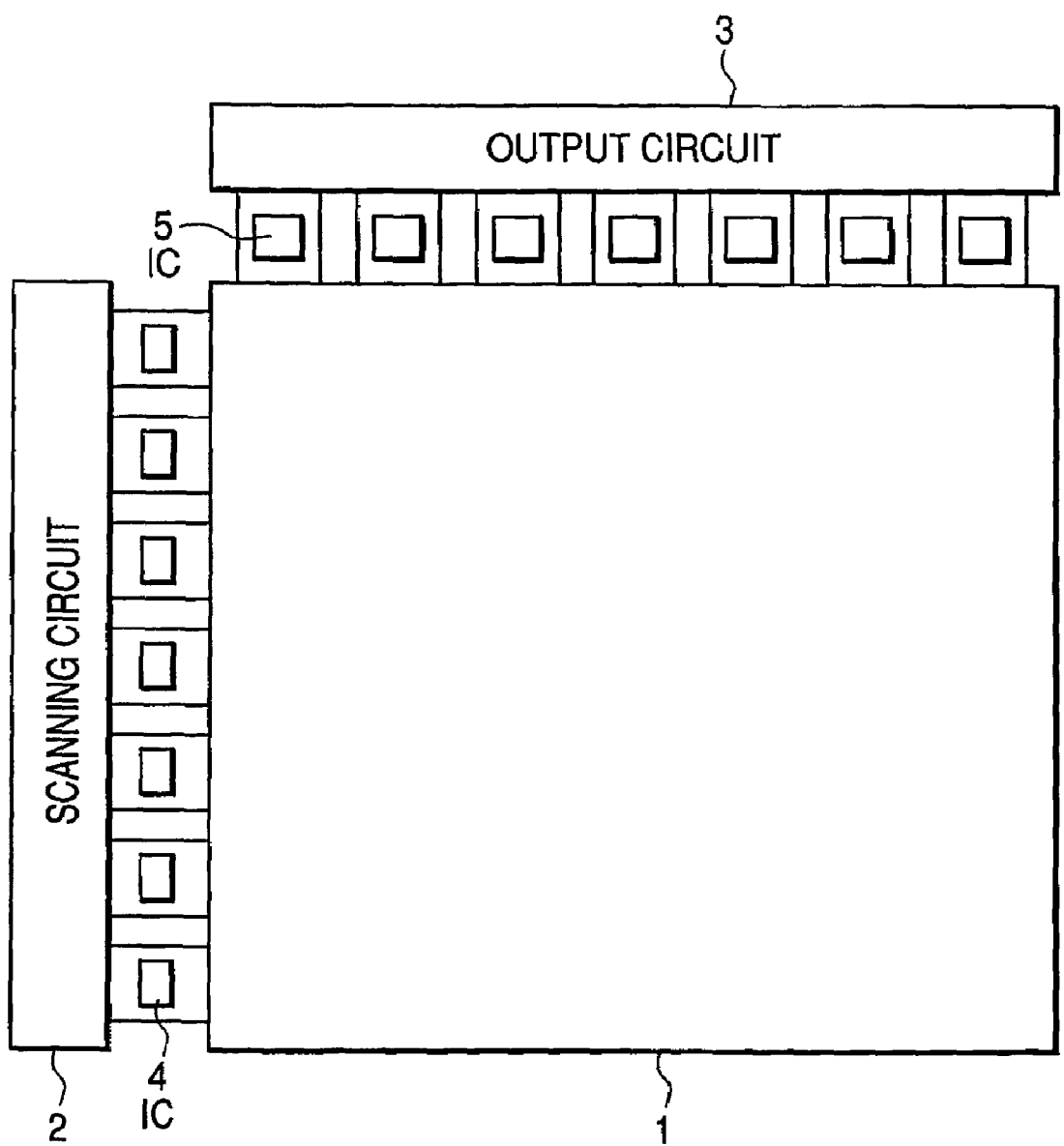
FIG. 1 is a schematic plan view schematically showing an example of a radiation image pick-up device according to a first embodiment of the present invention.

FIG. 1 is a schematic plan view schematically showing an example of a radiation image pick-up device according to a first embodiment of the present invention.

Figure 2:
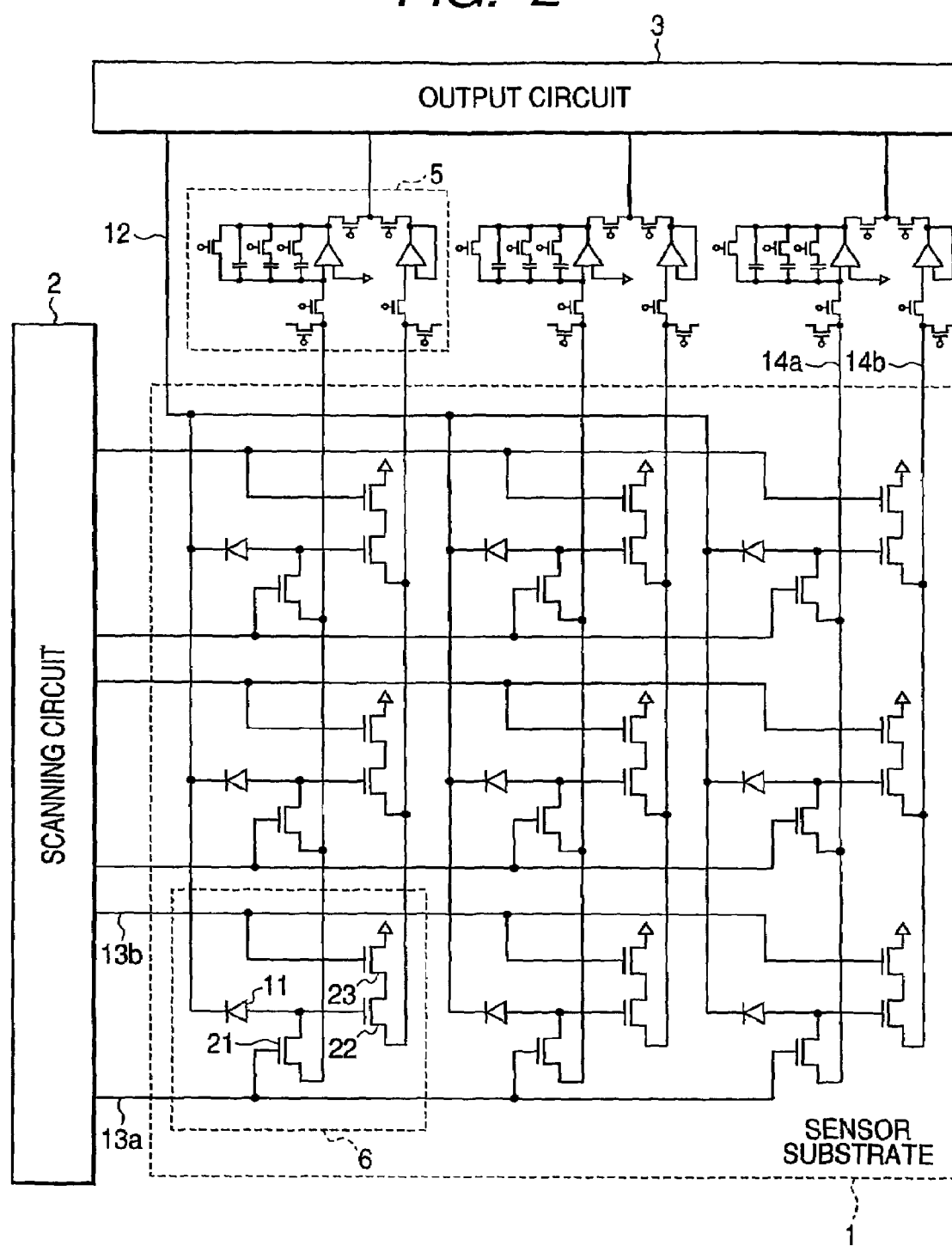
FIG. 2 is an equivalent circuit diagram of the radiation image pick-up device according to the first embodiment of the present invention.
Figure 3:
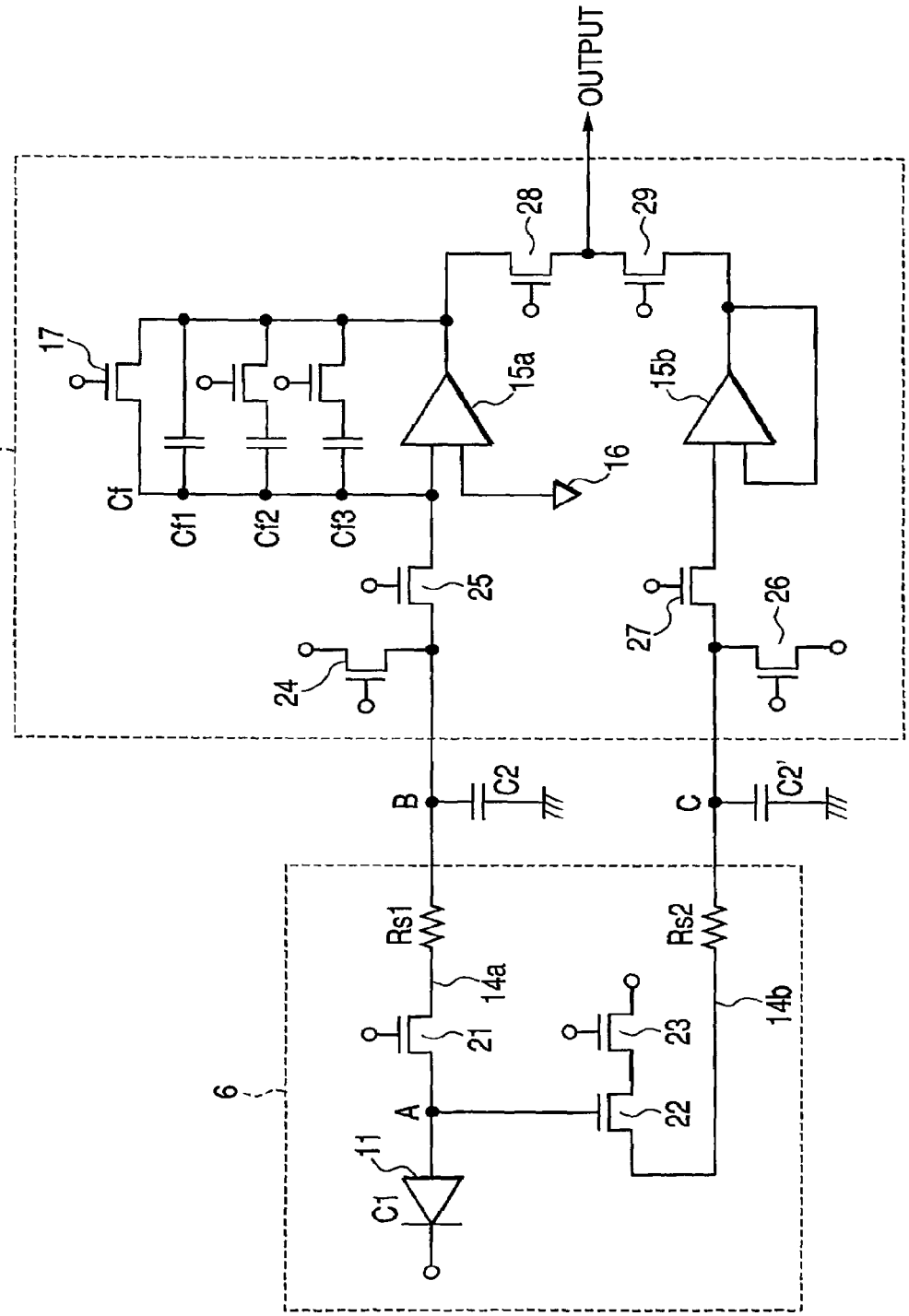
FIG. 3 is an equivalent circuit diagram of one pixel and a signal reading circuit in the radiation image pick-up device according to the first embodiment of the present invention.

FIG. 2 is an equivalent circuit diagram of the radiation image pick-up device according to the first embodiment of the present invention, and FIG. 3 is an equivalent circuit diagram of one pixel and a signal reading circuit in the radiation image pick-up device according to the first embodiment of the present invention.

As shown in FIG. 1, the radiation image pick-up device includes a sensor substrate 1 in which a plurality of pixels each having a photoelectric conversion function are disposed, a scanning circuit 2 for scanning the pixels, a signal output circuit 3 for outputting signals from the respective pixels, ICs 4 through which the sensor substrate 1 and the scanning circuit 2 are connected to each other, and ICs 5 through which the sensor substrate 1 and the signal output circuit 3 are connected to each other.

As shown in FIG. 2, a plurality of pixels 6 are disposed in matrix on the sensor substrate 1. Note that while 3×3 pixels are illustrated in a pixel area in FIG. 2 for the sake of convenience, in actuality, a large number of pixels, 1,000×2,000 pixels, for example, are disposed. In addition, similarly, the illustration of ICs of the scanning circuit is omitted here for the sake of convenience.

In this embodiment, as shown in FIGS. 2 and 3, each pixel 6 includes a photoelectric conversion element 11 as a semiconductor element for converting incident X-rays into electric charges, and semiconductor elements (switching elements) for reading out the resultant electric charges. The switching elements include a thin film transistor (TFT) 21 and a TFT 22 as a source follower which are provided so as to be freely selectable.

In each pixel 6, the photoelectric conversion element 11 is connected to the signal output circuit 3 through a bias line 12 which is common to all the pixels. Thus, a constant bias voltage is applied from the signal output circuit 3 to the photoelectric conversion element 11. In addition, two gate lines 13a and 13b which are common to every row in the matrix are provided for each pixel 6. Here, a gate electrode of the TFT 21 is connected to the scanning circuit 2 through the gate line 13a and a corresponding one of the ICs 4 (not shown), and a gate electrode of the TFT 23 is connected to the scanning circuit 2 through the gate line 13b and the corresponding one of the ICs 4 (not shown). Thus, the scanning circuit 2 controls operations (turn-ON/turn-OFF) of the TFTs 21 and 23(22). Moreover, two signal reading wirings (signal lines) 14a and 14b which are common to every column in the matrix are provided for each pixel 6. Here, a source or drain electrode of the TFT 21 is connected to the signal output circuit 3 through the signal line 14a and corresponding one of the ICs 5, and a source or drain electrode of the TFT 22 is connected to the signal output circuit 3 through the signal line 14b and the corresponding one of the ICs 5. Thus, in each pixel 6, any one of the signal lines 14a and 14b is freely selectable in reading out a signal therefrom.

As shown in FIGS. 2 and 3, each IC 5 includes an amplifier 15a and TFTs 24 and 25 which constitute the signal reading circuit, and an amplifier (operational amplifier) 15b and TFTs 26 and 27 which constitute the signal reading circuit. The amplifier 15a and the TFTs 24 and 25 are connected to the signal line 14a, and the amplifier 15b and the TFTs 26 and 27 are connected to the signal line 14b. Here, one input terminal of the amplifier 15a is connected to the signal line 14a, and the other input terminal thereof is connected to a power supply 16. Moreover, a gain switching circuit 17 including capacitors Cf1, Cf2, and Cf3 is connected to the amplifier 15a, and hence a gain of the amplifier 15a can be switched over to another one through the combination of the capacitors Cf1, Cf2, and Cf3. Further, a TFT 28 is connected to an output terminal of the amplifier 15a, and a TFT 29 is connected to an output terminal of the amplifier 15b so that a signal can be outputted.

Figure 4:
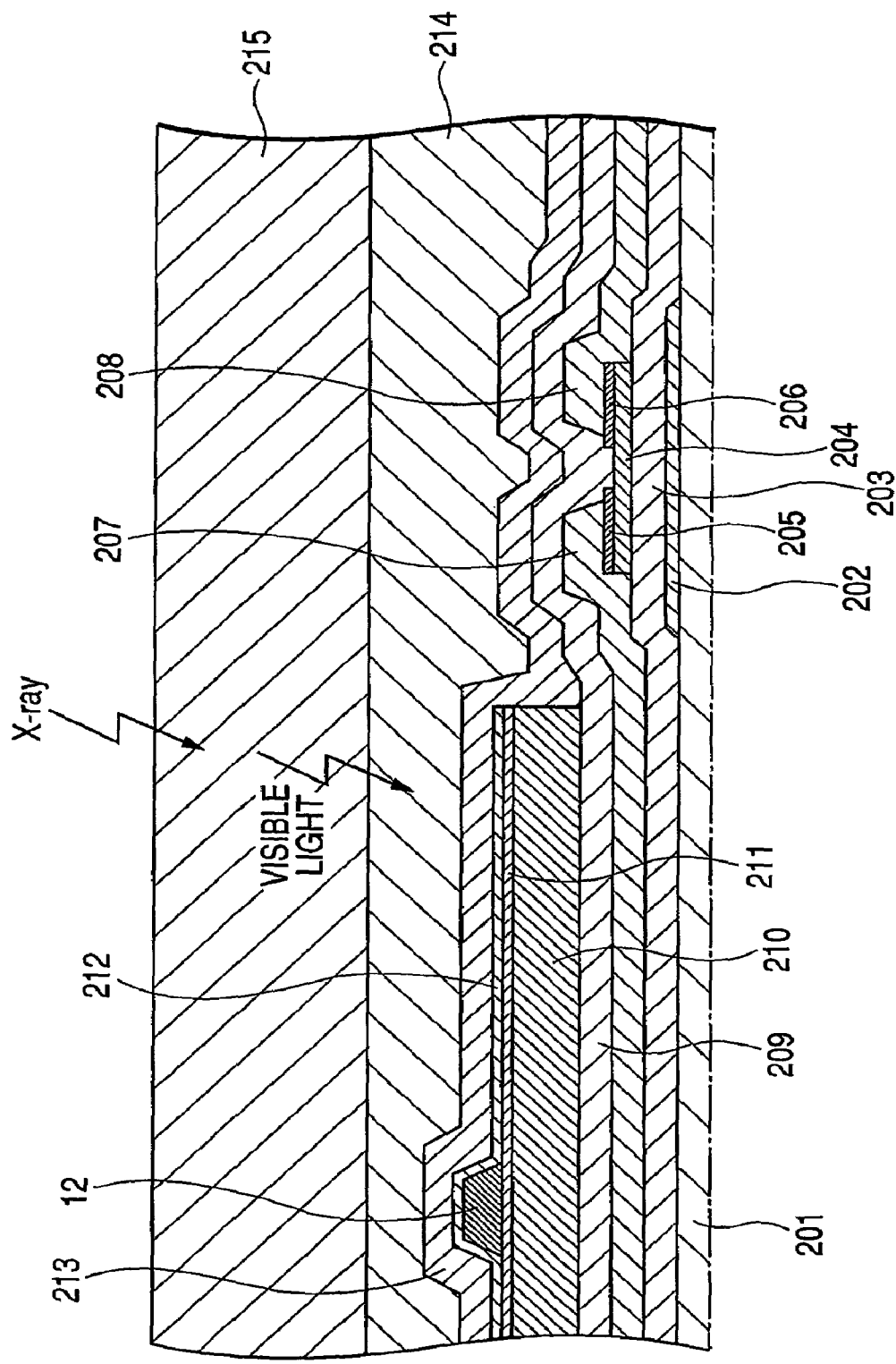
FIG. 4 is a schematic cross sectional view of a photoelectric conversion element and a TFT in the radiation image pick-up device according to the first embodiment of the present invention.

FIG. 4 is a schematic cross sectional view of the photoelectric conversion element 11 and the TFT 21 in the radiation image pick-up device.

The photoelectric conversion element 11 and the TFT 21 are structured as follows.

First of all, the TFT 21 will hereinafter be described.

A pattern of an electrode layer 202 that becomes a gate electrode is formed on a substrate 201, and an insulating layer 203 is deposited on the substrate 201 so as to cover the electrode layer 202. A pattern of a semiconductor layer 204 made of silicon or the like is formed on the insulating layer 203. Impurity ions are implanted at high concentration into both side portions of the semiconductor layer 204 to form a pair of impurity diffusion layers 205 and 206 that become a source and a drain. Patterns of electrode layers 207 and 208 that becomes source and drain electrodes are formed in patterns so as to be connected to the impurity diffusion layers 205 and 206, respectively, thereby structuring the TFT 21.

Next, the photoelectric conversion element 11 will hereinafter be described.

An insulating layer 209 is deposited over the entire surface including upper surfaces of the electrode layers 202, 207, and 208. A pattern of a semiconductor layer 210 made of silicon or the like is formed on the insulating layer 209 so as to be adjacent to the TFT 21. An n+-type semiconductor layer 211 that becomes a high-concentration, n-type impurity region is formed in a surface layer of the semiconductor layer 210. A pattern of a bias line 12 is formed on the n+-type semiconductor layer 211. A pattern of an electrode layer 212 is formed on the n+-type semiconductor layer 211, including upper faces of the bias line 12 so as to be connected to the bias line 12. Also, a passivation layer 213 is deposited on an entire surface, including the electrode layer 212 and the insulating layer 209 on the TFT 21 side. Moreover, an adhesion layer 214 having a flattened surface is formed so as to cover the passivation layer 213, and a phosphor layer 215 as a wavelength conversion member is formed on the adhesive layer 214, thereby structuring the photoelectric conversion element 11. Note that an organic passivation layer made of PI or the like may be formed between the passivation layer 213 and the adhesion layer 214.

Here, let us consider the noises generated in the radiation image pick-up device of this embodiment.

The noises which are generated when no electric charge amplification is carried out within the pixel 6 depend on a kTC1 noise, a resistance noise of the signal line 14a, a parasitic capacity noise of the signal line 14a, and a noise of the amplifier 15a (including the gain switching circuit 17). On the other hand, the noises which are generated when the electric charge amplification is carried out within the pixel 6 using the TFT 22 as the source follower circuit depend on the kTC1 noise, and a noise of the source follower circuit. At this time, the noise of the source follower circuit is very low in level. That is, higher sensitivity (S/N ratio) is obtained when the electric charge amplification is carried out within the pixel 6 using the source follower circuit rather than when no electric charge amplification is carried out within the pixel 6.

Then, in the radiation image pick-up device of this embodiment, the signal line is switched over to another one in correspondence to the sensitivity required for each photographing mode to take the X-ray photograph. That is, any one of the signal lines 14a and 14b is freely selectable in each pixel 6 in reading out a signal. The signal line 14a is selected for the photographing mode involving a high dosage of exposure to the X-rays, such as the still image photographing or a non-destructive inspection of the human body, and no electric charge amplification is carried out within the pixel. On the other hand, the signal line 14b is selected for the photographing mode involving a low dosage of exposure to the X-rays, such as the moving image photographing of the human body, and the electric charge amplification is carried out within the pixel using the source follower circuit.

A description will hereinafter be given to a specific photographing method employed when each signal line is selected.

(1) Photographing Mode Involving High Dosage of Exposure to X-Rays, Such as Still Image Photographing or Non-Destructive Inspection In this case, the signal line 14a is selected in a manner as will be described below, and no electric charge amplification is carried out within the pixel 6, and an output signal of the pixel 6 is read out through the signal line 14a. Here, a capacity of the photoelectric conversion element 11 is assigned C1, a parasitic capacity of the signal line 14a is assigned C2, and a capacity determined by capacities of the capacitors Cf1, Cf2, and Cf3 of the amplifier 15a is assigned Cf.

First of all, the TFTs 23, 26, 27, and 29 which are provided on the signal line 14b side are all turned OFF.

The X-ray applied to a subject for exposure is attenuated as it is transmitted through the subject to be wavelength-converted into visible light by the phosphor layer 215 as the wavelength conversion member shown in FIG. 4. The resultant visible light is then made incident on the photoelectric conversion element 11 to be converted into electric charges Q.

Subsequently, the TFTs 21 and 25 which are connected to the signal line 14a are both turned ON to set a gain of 1/Cf-fold in the amplifier 15a. As a result, the output voltage Vout is expressed by Vout=−Q/Cf. Then, the TFT 28 provided on the signal line 14a side is turned ON, thereby reading out that output signal from the signal output circuit 3 to the outside. After the output signal is read out, the TFT 24 connected to the signal line 14a is turned ON to remove the electric charges still remaining in the photoelectric conversion element 11. Here, in the amplifier 15a, a gain can be switched over to another one through the combination of the capacitors Cf1 to Cf3.

(2) Photographing Mode Involving Low Dosage of Exposure to X-Rays, Such as Moving Image Photographing of Human Body In this case, the signal line 14b is selected in a manner as will be described below, and the electric charge amplification is carried out within the pixel 6 to read out an output signal of the pixel 6 through the signal line 14b. Here, a threshold voltage of the TFT 22 as the source follower circuit is assigned Vth.

First of all, the TFTs 21, 24, 25, and 28 which are provided on the signal line 14a side are all turned OFF, while the TFT 23 connected to the signal line 14a is turned ON.

Similarly to the case of the still image photographing, the X-ray applied to a subject for exposure is attenuated as it is transmitted through the subject to be wavelength-converted into visible light by the phosphor layer 215 as the wavelength conversion member shown in FIG. 4. The resultant visible light is then made incident on the photoelectric conversion element 11 to be converted into electric charges. The resultant electric charges cause an electric potential fluctuation Vin corresponding to a quantity of incident light to the photoelectric conversion element 11 in a gate electrode of the TFT 22. Upon turn-ON of the TFT 22, an electric potential at a point C becomes (Vin−Vth) due to this electric potential fluctuation Vin. In this case, for example, if the threshold voltage Vth is sufficiently small, then the signal obtained at the point C becomes a voltage signal which is substantially equal to the voltage signal Vin.

The TFTs 27 and 29 which are provided on the signal line 14b side are both turned ON, whereby the above voltage signal is read out from the signal output circuit 3 to the outside through the amplifier 15b. After that voltage signal is read out, the TFT 26 connected to the signal line 14b is turned ON to remove the electric charges still remaining in the photoelectric conversion element 11.

Note that, in this embodiment, when the electric charges still remaining in the photoelectric conversion element 11 are removed, the TFT 24 or 26 is used. However, as in the prior art, an electric potential of the bias line 12 may be changed, or a voltage of the power supply 16 may be changed.

As described above, according to this embodiment, there is realized the inexpensive and high-performance radiation image pick-up device which is capable of freely switching sensitivity over to another one in correspondence to a situation and an object of the photographing to flexibly cope therewith, i.e., capable of carrying out both the still image photographing and the moving image photographing for example which are largely different from each other in dosage of exposure to the X-rays, and are also different in required sensitivity so as to meet that request.

Note that while in this embodiment, a photoelectric conversion element of a MIS type is adopted as the photoelectric conversion element 11, even when a photoelectric conversion element of a PIN type is adopted, the same effects can be obtained. Moreover, in this embodiment, there has been exemplified the indirect type radiation image pick-up device in which the radiation is converted into the visible light in the phosphor layer 215, and the resultant visible light is converted into the electric charges in the photoelectric conversion element 11. However, even when the present invention is applied to a direct type radiation image pick-up device, using a material such as amorphous selenium, in which the radiation can be directly converted into the electric charges, the same effects can be obtained.

Modification

Figure 5:
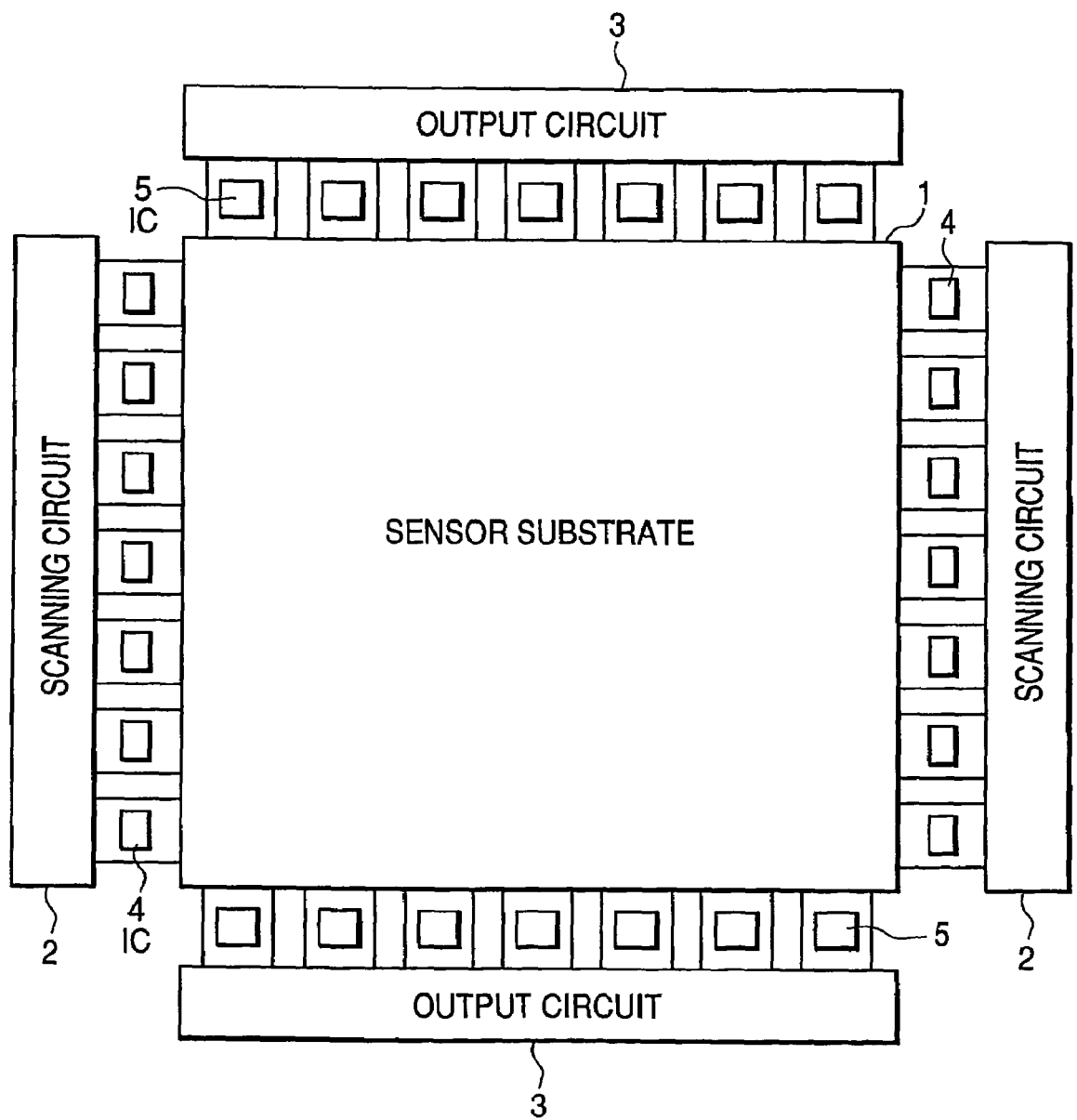
FIG. 5 is a schematic plan view schematically showing a modification of the radiation image pick-up device according to the first embodiment of the present invention.

In this embodiment, there is shown such a configuration that the scanning circuit 2 and the signal output circuit 3 are disposed only adjacent one sides of the sensor substrate 1, respectively. However, as shown in FIG. 5, the scanning circuit 2 and the signal output circuit 3 may also be disposed on two sets of opposite sides of the sensor substrate 1, respectively. In this case, an effect that a driving speed is increased, and so forth is offered in addition to the effects of the above-mentioned first embodiment. Hence, the more excellent radiation image pick-up device can be realized.

Second Embodiment

Next, a radiation image pick-up device according to a second embodiment of the present invention will hereinafter be described.

The radiation image pick-up device of this embodiment has nearly the same configuration as that of the radiation image pick-up device of the first embodiment but is different in that ICs of the signal output circuit is slightly different in configuration from those of the signal output circuit of the first embodiment.

Figure 6:
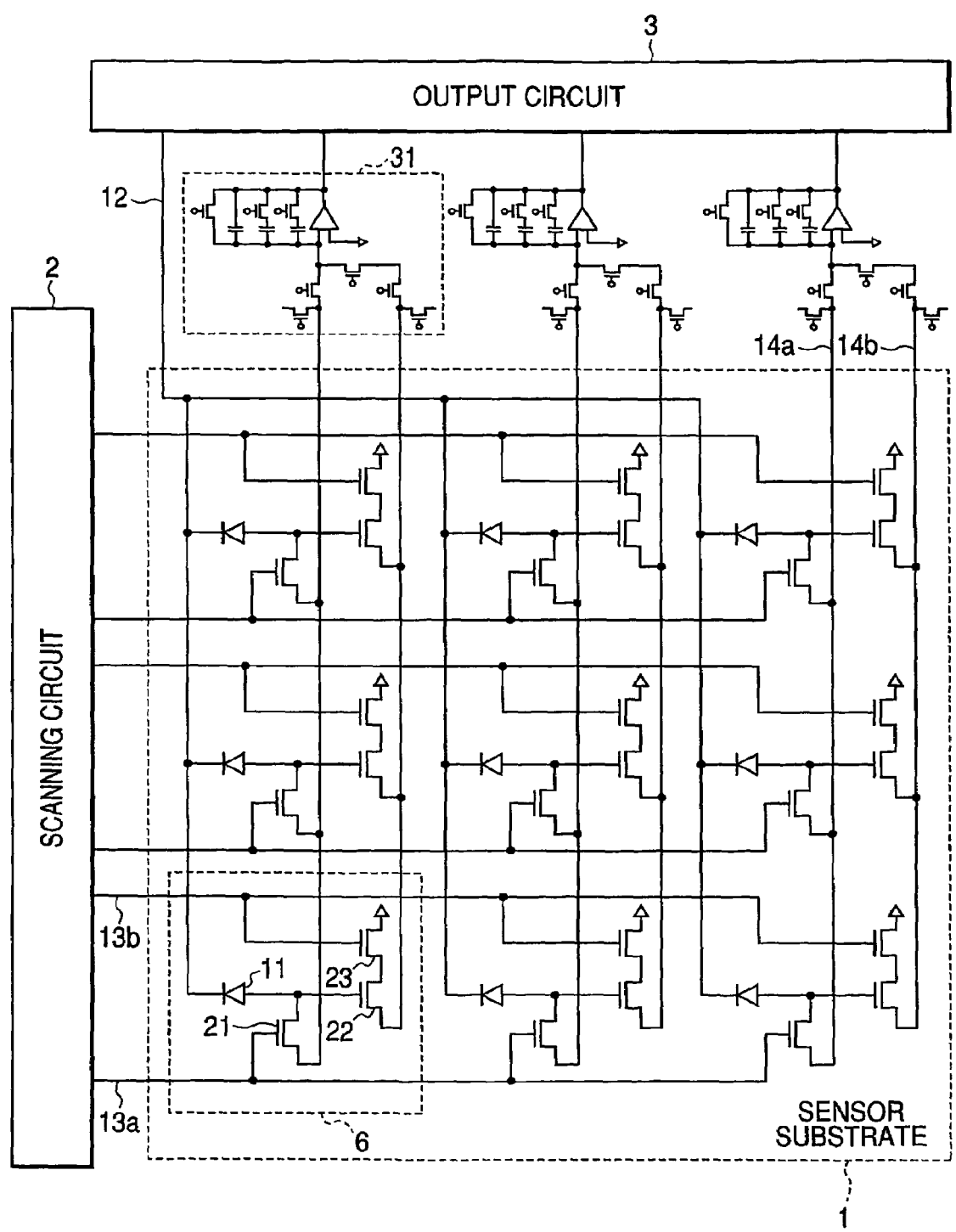
FIG. 6 is an equivalent circuit diagram of a radiation image pick-up device according to a second embodiment of the present invention.
Figure 7:
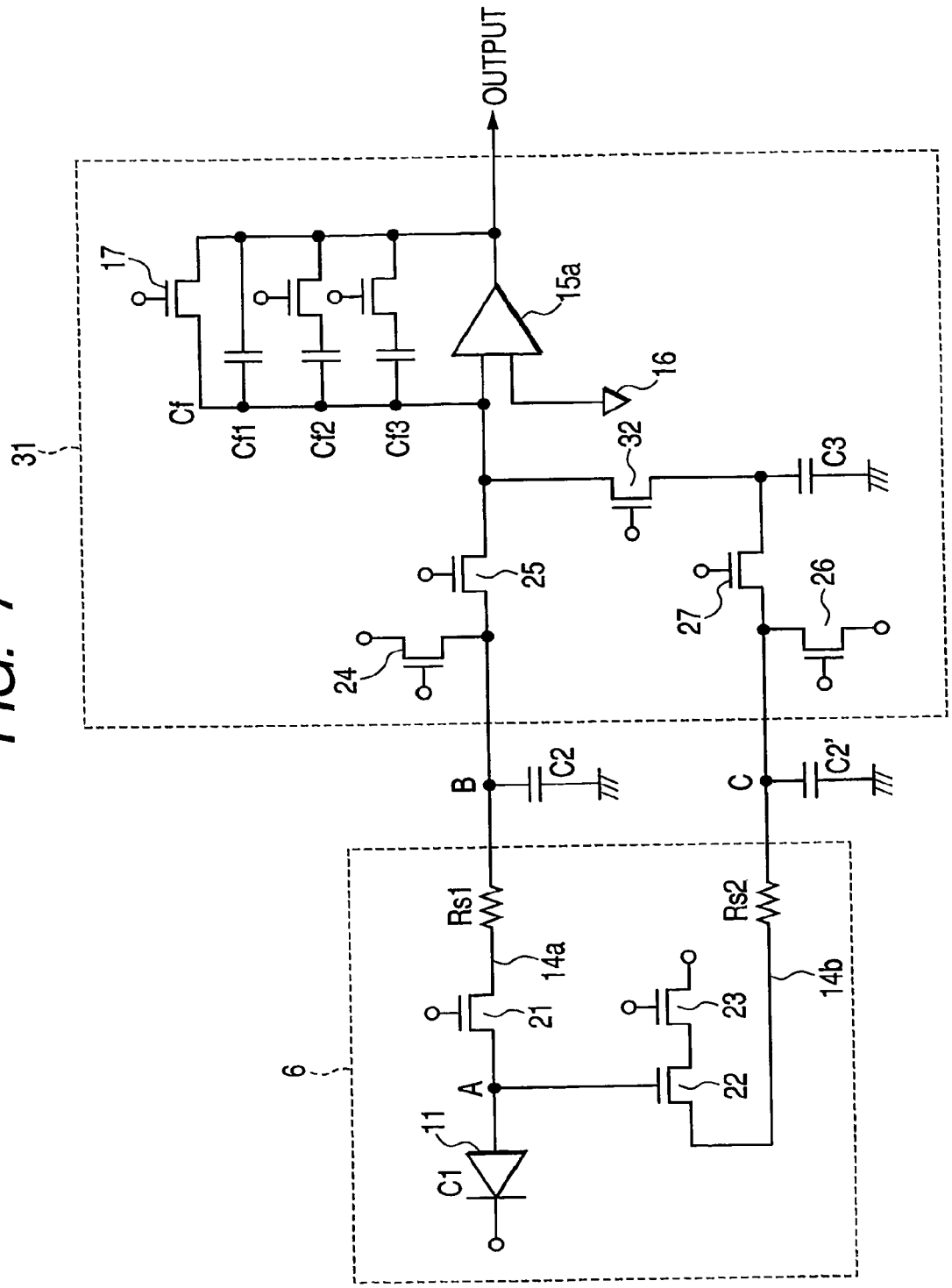
FIG. 7 is an equivalent circuit diagram of one pixel and a signal reading circuit in the radiation image pick-up device according to the second embodiment of the present invention.

FIG. 6 is an equivalent circuit diagram of the radiation image pick-up device according to the second embodiment of the present invention, and FIG. 7 is an equivalent circuit diagram of one pixel and the signal reading circuit in this radiation image pick-up device. Note that the constituent elements or the like corresponding to those of the first embodiment are designated with the same reference numerals.

An IC 31 of the signal output circuit 3 of this radiation image pick-up device, similarly to the case of the IC 5 of the first embodiment, is connected to a pixel 6 through signal lines 14a and 14b. Unlike the first embodiment, however, the IC 31 has no amplifier 15b, and the signal lines 14a and 14b are connected to a common amplifier 15a.

That is, in the IC 31, TFTs 24 and 25 are connected to the signal line 14a, and TFTs 26 and 27 are connected to the signal line 14b. Also, the signal lines 14a and 14b are connected to each other through a TFT 32 to be connected to one input terminal of the amplifier 15a, and a power supply 16 is connected to the other input terminal of the amplifier 15a. Moreover, a gain switching circuit 17 having capacitors Cf1, Cf2, and Cf3 is connected to the amplifier 15a.

A description will hereinafter be given to a specific photographing method employed when each signal line is selected in this radiation image pick-up device.

(1) Photographing Mode Involving High Dosage of Exposure to X-Rays, Such as Still Image Photographing or Non-Destructive Inspection In this case, the signal line 14a is selected in a manner as will be described below, and no electric charge amplification is carried out within the pixel 6, and an output signal of the pixel 6 is read out through the signal line 14a. Here, a capacity of the photoelectric conversion element 11 is assigned C1, a parasitic capacity of the signal line 14a is assigned C2, and a capacity determined by the capacitors Cf1, Cf2, and Cf3 of the photoelectric conversion element 11 is assigned Cf.

First of all, the TFTs 23, 26, 27, and 32 which are provided on the signal line 14b side are all turned OFF.

The X-ray applied to a subject for exposure is attenuated as it is transmitted through the object to be wavelength-converted into visible light in the phosphor layer 215 as the wavelength conversion member shown in FIG. 4. The resultant visible light is then made incident on the photoelectric conversion element 11 to be converted into electric charges Q.

Subsequently, upon turn-ON of the TFTs 21 and 25 connected to the signal line 14a, a gain of 1/Cf-fold is set in the amplifier 15a. As a result, an output voltage Vout is expressed by Vout=−Q/Cf. This voltage signal is then read out from the signal output circuit 3 to the outside. After the voltage signal is read out, a TFT 24 connected to the signal line 14a side is turned ON to remove the electric charges still remaining in the photoelectric conversion element 11. Here, in the amplifier 15a, a gain can be switched over to another one through the combination of the capacitors Cf1 to Cf3.

(2) Photographing Mode Involving Low Dosage of Exposure to the X-Rays, Such as the Moving Image Photographing of Human Body.

In this case, the signal line 14b is selected in a manner as will be described below, and the electric charge amplification is carried out within the pixel 6, and an output signal of the pixel 6 is read out through the signal line 14b. Here, a threshold voltage of the TFT 22 connected to the signal line 14b side is assigned Vth.

First of all, the TFTs 21, 24, and 25 which are connected to the signal line 14a side are all turned OFF, while the TFT 23 connected to the signal line 14a side is turned ON.

Similarly to the case of the still image photographing, the X-ray applied to a subject for exposure is attenuated as it is transmitted through the subject to be wavelength-converted into visible light in the phosphor layer 215 as the wavelength conversion member shown in FIG. 4. The resultant visible light is then made incident on the photoelectric conversion element 11 to be converted into electric charges Q. The resultant electric charges Q cause an electric potential fluctuation Vin corresponding to a quality of incident light on the photoelectric conversion element 11 in a gate electrode of the TFT 22. Upon turn-ON of the TFT 22, a voltage at a point C becomes (Vin−Vth) due to the electric potential fluctuation.

For example, if the threshold voltage Vth is sufficiently small, then the voltage signal at the point C becomes a voltage signal which is substantially equal to the electric potential fluctuation Vin.

Upon turn-ON of the TFT 27 connected to the signal line 14b side, the electric charges are accumulated in the capacitor C3. In this state, upon turn-ON of the TFT 32, a gain of 1/Cf-fold is set in the amplifier 15a. As a result, an output voltage Vout is expressed by Vout=−Q/Cf. This voltage signal is then read out from the signal output circuit 3 to the outside through the amplifier 15a. After the voltage signal is read out, the TFT 26 connected to the signal line 14b is turned ON to remove the electric charges still remaining in the photoelectric conversion element 11.

In this embodiment, in the amplifier 15a, the gain can be switched over to another one through the combination of the capacitors Cf1 to Cf3. Hence, unlike the case where the electric charge amplification is carried out within the pixel 6 in the first embodiment, a magnitude of the output signal can also be selected.

Note that while when the electric charges still remaining in the photoelectric conversion element 11 are removed, the TFT 24 or 26 is used, an electric potential of the bias line 12 may be changed, or a voltage of the power supply 16 may also be changed as in the prior art. In addition, in this embodiment as well, similarly to the change of the first embodiment, the scanning circuit 2 and the signal output circuit 3 may also be suitably provided in two sets of opposite sides of the sensor substrate 1, respectively.

Moreover, in the first and second embodiments, there have been described the example in which a consideration is given to the still image photographing (non-destructive inspection) and the moving image photographing as the photographing modes, and the two signal lines 14a and 14b are distributed for each pixel 6 so as for any one thereof to be freely selectable. However, it is also possible that three or more signal lines are distributed for each pixel in order to more finely cope with the photographing corresponding to the various kinds of photographing modes.

Third Embodiment

Next, a third embodiment of the present invention will hereinafter be described.

This embodiment discloses herein a radiation image pick-up system including the radiation image pick-up device described in the second embodiment of the first and second embodiments. Of course, the radiation image pick-up device described in the first embodiment can also be applied to this radiation image pick-up system. Note that the constituent elements or the like corresponding to those of the first and second embodiments are designated with the same reference numerals.

Figure 8:
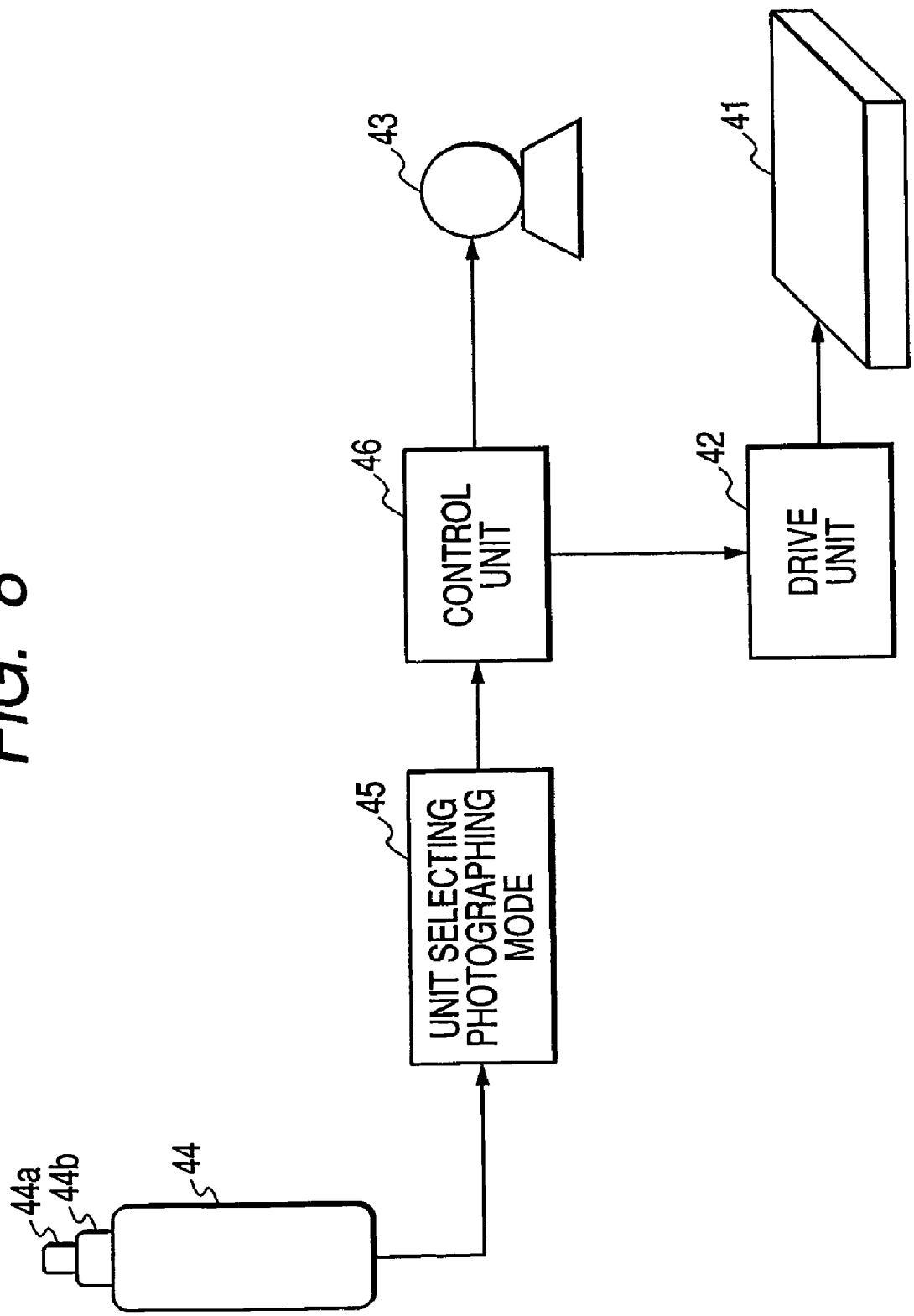
FIG. 8 is a schematic view schematically showing an example of a radiation image pick-up system according to a third embodiment of the present invention.
Figure 9:
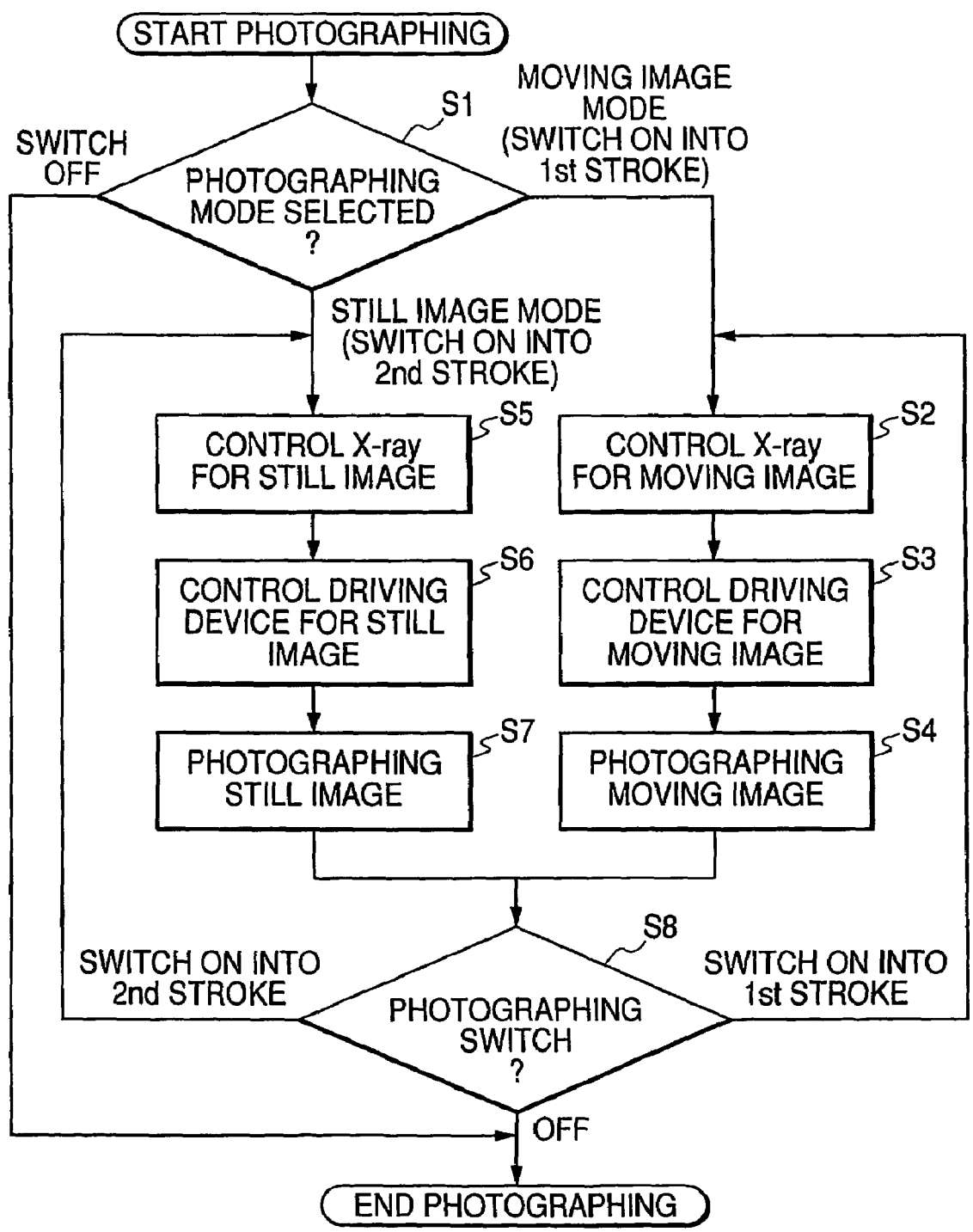
FIG. 9 is a flow chart showing an operation of the radiation image pick-up system according to the third embodiment of the present invention.
Figure 10:
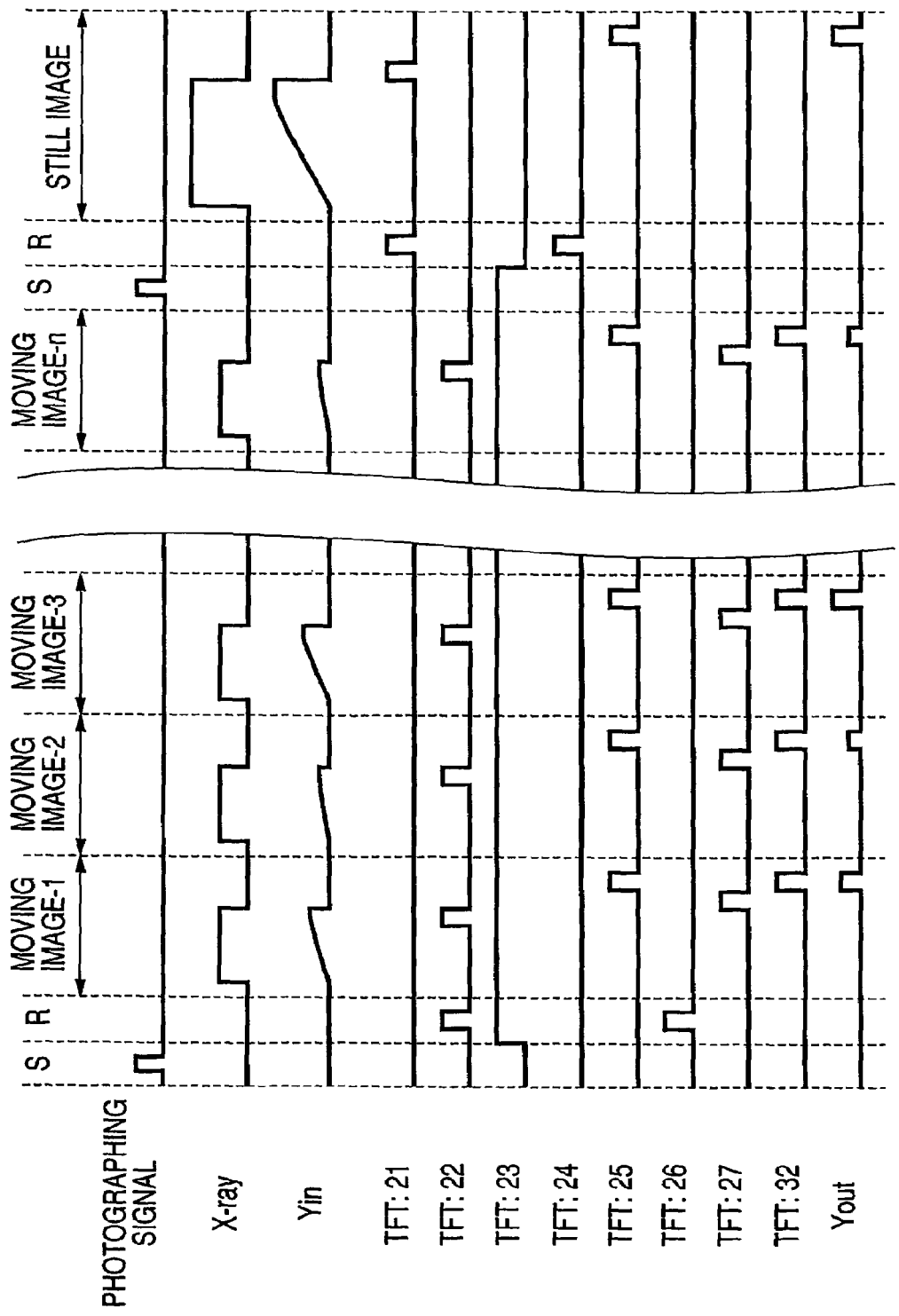
FIG. 10 is a timing chart explaining an image pick-up operation using the radiation image pick-up system according to the third embodiment of the present invention.
Figure 11:
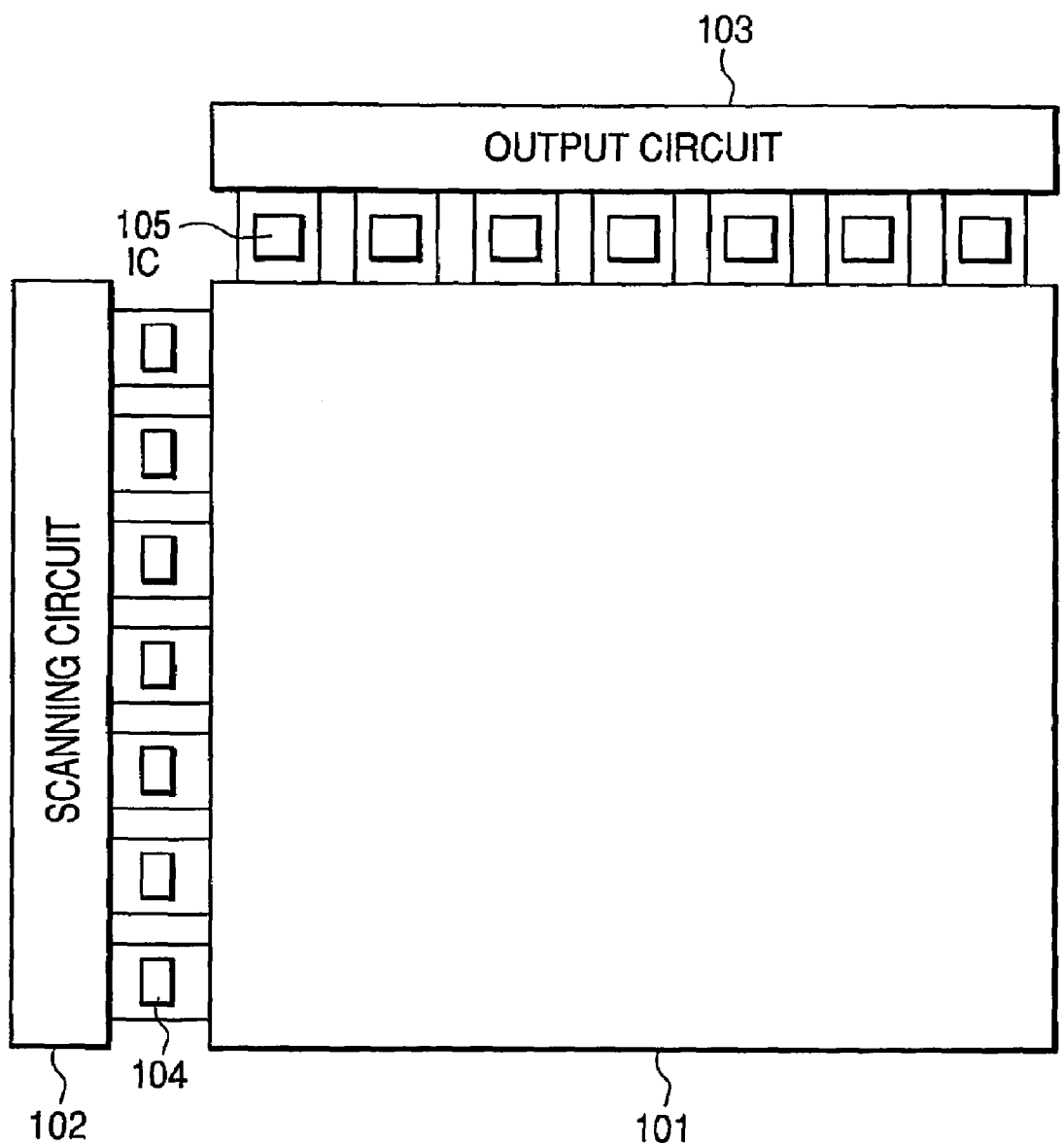
FIG. 11 is a schematic plan view schematically showing an example of a radiation image pick-up device according to a prior art.
Figure 12:
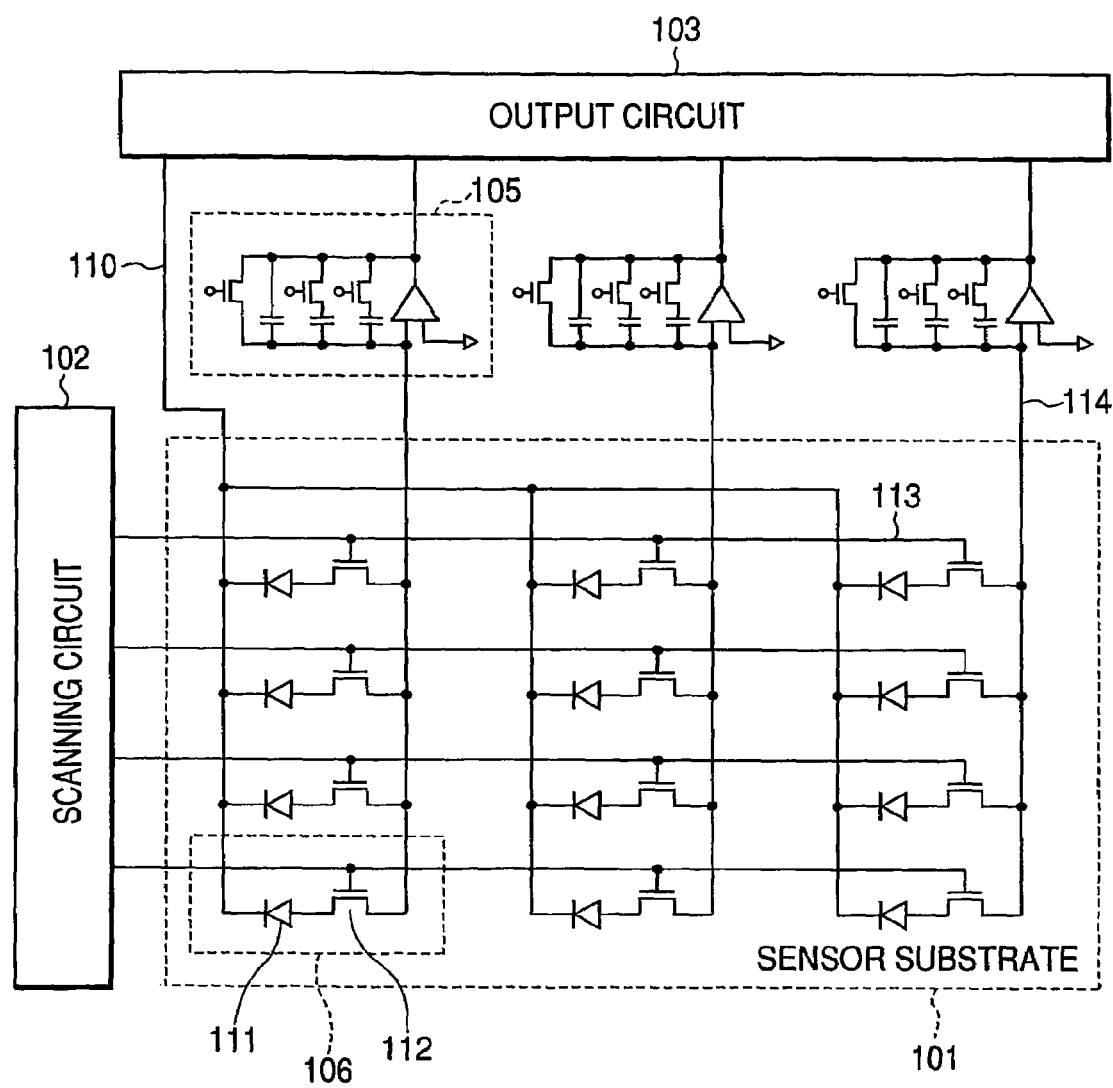
FIG. 12 is an equivalent circuit diagram of the radiation image pick-up device according to the prior art.
Figure 13:
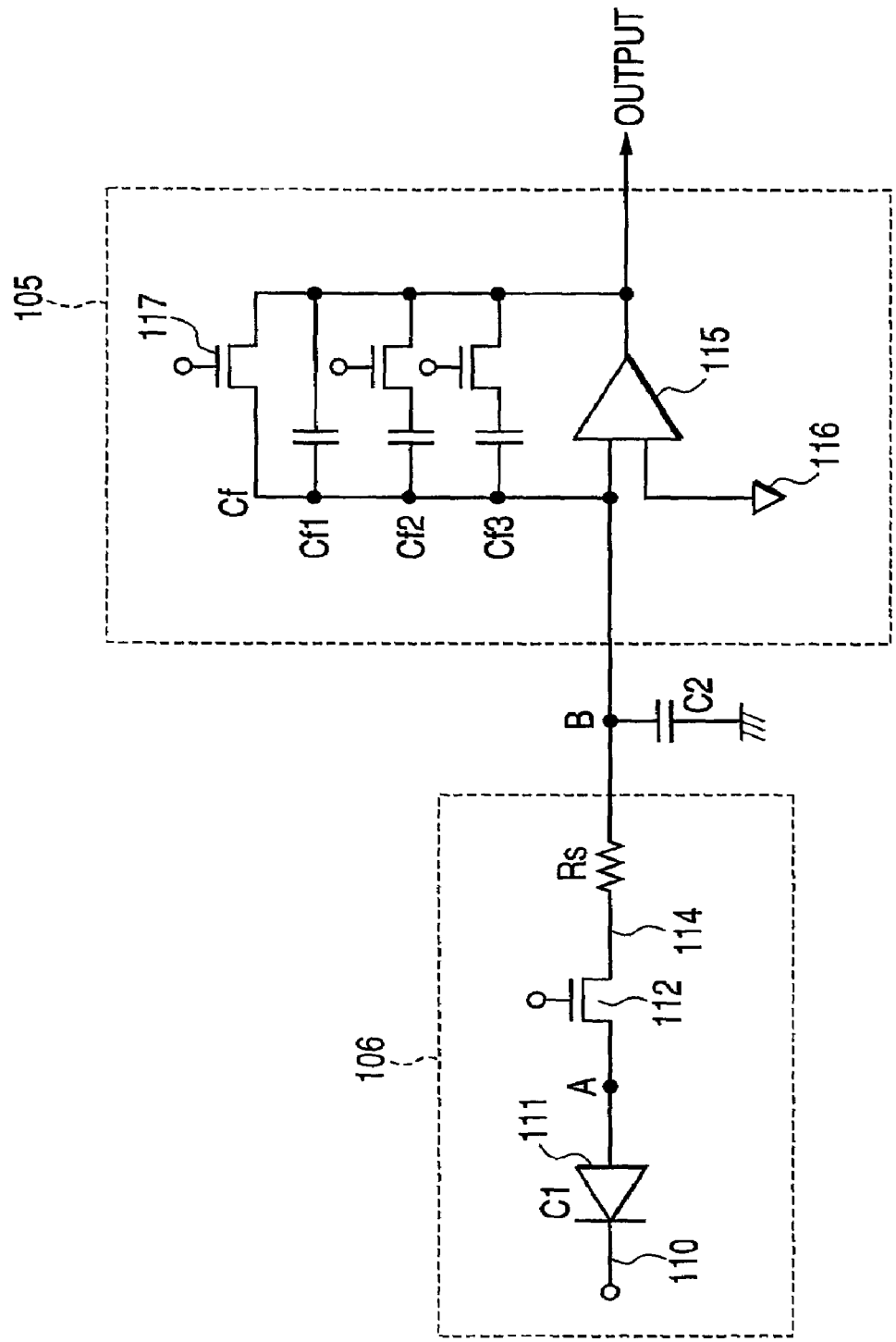
FIG. 13 is an equivalent circuit diagram of one pixel and a signal reading circuit in the radiation image pick-up device according to the prior art.

FIG. 8 is a schematic block diagram schematically showing the radiation image pick-up system according to the third embodiment of the present invention, FIG. 9 is a flow chart showing an operation of the radiation image pick-up system, and FIG. 10 is a timing chart of an image pick-up operation using the radiation image pick-up system.

As shown in FIG. 8, the radiation image pick-up system includes the radiation image pick-up device 41 described in the second embodiment, a drive unit 42 for driving the radiation image pick-up device 41, an X-ray generation unit 43 for applying radiation, i.e., an X-ray in this case to a subject, an image pick-up switch 44 with which any one of the signal lines 14a and 14b is freely selectable by an operator, a photographing mode selection unit 45 for outputting an electrical signal representing that any one of the signal lines 14a and 14b is selected based on an input to the image pick-up switch 44, and a control unit 46 for controlling operations of the X-ray generation unit 43 and the drive unit 42 based on the electrical signal sent from the photographing mode selection unit 45.

The selection of the image pick-up mode can be carried out with the image pick-up switch 44, which is adapted to be switched ON into strokes corresponding to the number of signal lines 14a and 14b, i.e., into two strokes in this case. The strokes correspond to an increase in a dosage in ascending order. In a state in which a switch 44a is switched ON into the first stroke, the moving image mode is selected, while in a state in which a switch 44b is switched ON into the second stroke, the still image mode is selected. Note that it is configured such that when the switch 44b is switched ON into the second stroke, the switch 44a is also switched ON simultaneously into the first stroke. Since the photographing is repeatedly carried out by continuing to switch ON the image pick-up switch 44, for example, the switch 44b of the image pick-up switch 44 is switched ON into the second stroke during the photographing of the moving image, thereby allowing the still image to be photographed. For end of the photographing, the image pick-up switch 44 has to be switched OFF (a state of the switching-OFF has to be provided for the image pick-up switch 44).

Here, a description will hereinafter be given to the control for the dosage of the X-rays in the X-ray generation unit 43 made by the control unit 46.

In case of the still image mode, there is generated a relatively high dosage of X-rays used to take an X-ray photograph of the breast through the still image photographing or the like. On the other hand, in case of the moving image mode, since a subject (patient) is irradiated with the X-rays for a long period of time, in this case, a low dosage of pulse-like X-rays is generated.

In addition, as described in the second embodiment, the drive unit 46 controls the radiation image pick-up device 41 such that in the case of the still image photographing, no electric charge amplification is carried out within the pixel, and the output signal is read out to the outside through the signal line 14a, while in the case of the moving image photographing, the electric charge amplification is carried out within the pixel using the source follower circuit, and the output signal is read out to the outside through the signal line 14b.

In the radiation image pick-up system according to this embodiment, as shown in FIG. 9, first of all, a photographing mode is selected by an operator (Step S1). That is, when the switch 44a or 44b of the photographing switch 44 is switched ON into the first or second stroke, the photographing mode is selected by the photographing mode selection unit 45. Subsequently, when the moving image mode is selected, the application of the X-rays corresponding to the moving image by the X-ray generation unit 43 is started (Step S2) and the control for the radiation image pick-up device 41 through the drive circuit 42 is started (Step S3) by the control unit 46 to carry out the moving image photographing (Step S4). On the other hand, when the still image mode is selected, the application of the X-rays corresponding to the still image by the X-ray generation unit 43 is started (Step S5) and the control for the radiation image pick-up device 41 through the drive circuit 42 is started (Step S6) by the control unit 46 to carry out the still image photographing (Step S7).

Then, in Step S8, when the photographing is further continued to be carried out, in the case of the moving image photographing, the switch 44a of the photographing switch 44 is continued to be switched ON into the first stroke, while in the case of the still image photographing, the switch 44b of the photographing switch 44 is continued to be switched ON into the second stroke. When the photographing is intended to come to an end, the photographing switch 44 is just switched OFF.

Subsequently, with reference to FIG. 10, a description will hereinafter be given to an operation of the radiation image pick-up device when the photographing proceeds from the moving image photographing to the still image photographing.

When the switch 44a of the photographing switch 44 is switched ON into the first stroke to select the moving image mode, a photographing signal is inputted to the radiation image pick-up device 41. Subsequently, the TFT 23 is turned ON by the drive unit 42, and the TFTS 26 and 22 are then turned ON, thereby resetting the circuit. Subsequently, the X-ray applied from the X-ray generation unit 43 to a subject is attenuated as it is transmitted through the subject to be wavelength-converted into visible light in the phosphor layer 215 as the wavelength conversion member shown in FIG. 4. The resultant visible light is made incident on the photoelectric conversion element 11 to be converted into electric charges Q. The resultant electric charges Q cause the electric potential fluctuation Vin corresponding to a quantity of incident light to the photoelectric conversion element 11 in the gate electrode of the TFT 22. The TFT 22 is turned ON due to that electric potential fluctuation Vin to accumulate the electric charges in the capacitor C2'. Subsequently, the TFT 27 is turned ON to accumulate the electric charges in the capacitor C3. Upon turn-On of the TFT 32, the output signal corresponding to the electric charges accumulated in the capacitor C3 is read out from the signal output circuit 3 to the outside. Then, while the switch 44a of the photographing switch 44 is switched ON into the first stroke, the moving image photographing is continuously repeated.

At this time, when the switch 44b of the photographing switch 44 is switched ON into the second stroke, the photographing proceeds to the still image photographing. In the case of the still image photographing, first of all, the TFTs 23, 22, 26, 27, and 32 which are provided on the signal line 14b side are all turned OFF. However, the photographing switch 44 may be switched ON at various timings such as a timing during the application of the X-rays, and a timing during the reading of the output signal. Thus, the TFTs 21 and 24 are turned ON right before the still image photographing, thereby resetting the circuit. Subsequently, the X-ray applied from the X-ray generation unit 43 to a subject is attenuated as it is transmitted through the subject to be wavelength-converted into visible light in the phosphor layer 215 as the wavelength conversion member shown in FIG. 4. The resultant visible light is made incident on the photoelectric conversion element 11 to be converted into electric charges Q. The resultant electric charges Q are accumulated in the capacitor C2 by turning ON the TFT 21. Subsequently, upon turn-ON of the TFT 25, the output signal corresponding to the electric charges Q accumulated in the capacitor C2 is read from the signal output circuit 3 to the outside through the amplifier 15a. Note that while essentially, the output signal Vout is expressed by Vout=−Q/Cf, in FIG. 10, the polarity of the output signal Vout is inverted to be expressed as plus (+).

As described above, according to this embodiment, there is realized the inexpensive and high-performance radiation image pick-up system which is capable of freely switching sensitivity over to another one in correspondence to a situation and an object of the image photographing to flexibly cope therewith, i.e., capable of carrying out both still image photographing and moving image photographing for example which are largely different from each other in dosage of exposure to the X-rays and which are also different in required sensitivity so as to meet that request.

As many apparently widely different embodiments of the present invention can be made without departing from the spirit and scope thereof, it is to be understood that the invention is not limited to the specific embodiments thereof except as defined in the claims.

The invention claimed is:

1. A radiation image pick up device comprising:
a pixel including a conversion element for converting incident radiation into an electric charge and first and second semiconductor elements for transferring a signal charge corresponding to the electric charge converted by the conversion element for storage or further processing; and
a scanning circuit for independently selecting the first and second semiconductor element.

2. A radiation image pick up device according to claim 1, wherein either of the first semiconductor element and the second semiconductor element is a source follower.

3. A radiation image pick up device according to claim 1, wherein the second semiconductor element is a source follower, and wherein the first semiconductor element is selected for a first dosage of the radiation, and the second semiconductor element is selected for a second dosage of the radiation, wherein the first dosage of the radiation is larger than the second dosage of the radiation.

4. A radiation image pick up device according to claim 1, further comprising:
a first signal wiring, through which the first semiconductor element transfers the signal charge;
a second signal wiring, through which the second semiconductor element transfers the signal charge; and
a signal read-out circuit for reading the signal charge through the first or second signal wiring.

5. A radiation image pick up device according to claim 4, wherein the signal read-out circuit has a first amplifier connected electrically to the first signal wiring and a second amplifier connected electrically to the second signal wiring.

6. A radiation image pick up device according to claim 4, wherein the signal read-out circuit has an amplifier connected electrically to the first signal wiring and the second signal wiring commonly, and has a gain switchable between at least two gain values.

7. A radiation image pick up device according to claim 1, further comprising a wavelength converter for converting a wavelength of the radiation into one which can be sensed by the conversion element.

8. A radiation image pick up system comprising:
a radiation image pick up device according to claim 1;
a selection unit for selecting any one of a plurality of radiographing modes of said radiation image pick-up device according to a magnitude of dosage of the radiation.

9. A sensor substrate for use in a radiation image pick-up device having a scanning circuit, comprising:
a pixel including a conversion element for converting incident radiation into an electric charge and first and second semiconductor elements for transferring a signal charge corresponding to the electric charge converted by the conversion element for storage or further processing; and
a scanning circuit for independently selecting the first and second semiconductor element.

10. A radiation image pick up device according to claim 1, comprising a sensor substrate, wherein the sensor substrate includes the pixel.

11. A radiation image pick up device comprising:
a pixel including a conversion element for converting incident radiation into an electric charge and first and second semiconductor elements, said first semiconductor element for transferring a signal charge corresponding to the electric charge converted by the conversion element for storage or further processing without use of said second semiconductor element, and said second semiconductor element for transferring a signal charge corresponding to the electric charge converted by the conversion element for storage or further processing without use of said first semiconductor element; and
a scanning circuit for independently selecting the first and second semiconductor element.

* * * * *